United States Patent
Weingarten et al.

(10) Patent No.: US 9,407,291 B1
(45) Date of Patent: Aug. 2, 2016

(54) PARALLEL ENCODING METHOD AND SYSTEM

(71) Applicant: DENSBITS TECHNOLOGIES LTD., Haifa (IL)

(72) Inventors: Hanan Weingarten, Herzelia (IL); Avi Steiner, Kiryat Motzkin (IL)

(73) Assignee: AVAGO TECHNOLOGIES GENERAL IP (SINGAPORE) PTE. LTD., Yishun (SG)

( * ) Notice: Subject to any disclaimer, the term of this patent is extended or adjusted under 35 U.S.C. 154(b) by 0 days.

(21) Appl. No.: 14/481,681

(22) Filed: Sep. 9, 2014

Related U.S. Application Data

(63) Continuation of application No. 14/323,857, filed on Jul. 3, 2014.

(51) Int. Cl.
  *H03M 13/00* (2006.01)
  *H03M 13/27* (2006.01)
  *H03M 13/29* (2006.01)

(52) U.S. Cl.
  CPC ...... *H03M 13/2703* (2013.01); *H03M 13/2906* (2013.01); *H03M 13/611* (2013.01)

(58) Field of Classification Search
  CPC .............. H03M 13/2918; H03M 13/2906; H03M 13/152; G06F 11/1068
  See application file for complete search history.

(56) References Cited

U.S. PATENT DOCUMENTS

| | | |
|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Bryg et al. |
| 5,729,490 A | 3/1998 | Calligaro et al. |
| 5,740,395 A | 4/1998 | Hasbun et al. |

(Continued)

OTHER PUBLICATIONS

Search Report of PCT Patent Application WO 2009/118720 A3, Mar. 4, 2010.

(Continued)

*Primary Examiner* — Esaw Abraham
(74) *Attorney, Agent, or Firm* — Reches Patents

(57) ABSTRACT

A method for parallel multi-dimensional encoding, the method may include receiving or generating a first version of a group of bits and a second version of the group of bits, wherein the first and second versions differ from each other by an arrangement of bits of the data unit; selecting a first set of bits of the first version and a second set of bits of the second version; encoding, in parallel, the first set of bits and the second set of bits; wherein the encoding of the second set of bits is responsive to the second set of bits and a first redundancy result of the encoding of the first set of bits; and wherein the encoding of the first set of bits is responsive to the first set of bits and to a second redundancy result of the encoding of the second set of bits.

20 Claims, 6 Drawing Sheets

(56) References Cited

U.S. PATENT DOCUMENTS

| | | | |
|---|---|---|---|
| 5,745,418 | A | 4/1998 | Hu et al. |
| 5,778,430 | A | 7/1998 | Giovannetti et al. |
| 5,793,774 | A | 8/1998 | Usui et al. |
| 5,805,228 | A * | 9/1998 | Proctor et al. .......... 375/240.22 |
| 5,920,578 | A | 7/1999 | Zook et al. |
| 5,926,409 | A | 7/1999 | Engh et al. |
| 5,933,368 | A | 8/1999 | Hu et al. |
| 5,956,268 | A | 9/1999 | Lee |
| 5,956,473 | A | 9/1999 | Hu et al. |
| 5,968,198 | A | 10/1999 | Balachandran |
| 5,982,659 | A | 11/1999 | Irrinki et al. |
| 6,011,741 | A | 1/2000 | Harari et al. |
| 6,016,275 | A | 1/2000 | Han |
| 6,023,783 | A * | 2/2000 | Divsalar et al. .............. 714/792 |
| 6,038,634 | A | 3/2000 | Ji et al. |
| 6,081,878 | A | 6/2000 | Estakhri et al. |
| 6,094,465 | A | 7/2000 | Stein et al. |
| 6,119,245 | A | 9/2000 | Hiratsuka |
| 6,182,261 | B1 | 1/2001 | Haller et al. |
| 6,192,497 | B1 | 2/2001 | Yang et al. |
| 6,195,287 | B1 | 2/2001 | Hirano |
| 6,199,188 | B1 | 3/2001 | Shen et al. |
| 6,209,114 | B1 | 3/2001 | Wolf et al. |
| 6,259,627 | B1 | 7/2001 | Wong |
| 6,272,052 | B1 | 8/2001 | Miyauchi |
| 6,278,633 | B1 | 8/2001 | Wong et al. |
| 6,279,133 | B1 | 8/2001 | Vafai et al. |
| 6,301,151 | B1 | 10/2001 | Engh et al. |
| 6,304,985 | B1 * | 10/2001 | Sindhushayana et al. .... 714/702 |
| 6,370,061 | B1 | 4/2002 | Yachareni et al. |
| 6,374,383 | B1 | 4/2002 | Weng |
| 6,504,891 | B1 | 1/2003 | Chevallier |
| 6,532,169 | B1 | 3/2003 | Mann et al. |
| 6,532,556 | B1 | 3/2003 | Wong et al. |
| 6,553,533 | B2 | 4/2003 | Demura et al. |
| 6,560,747 | B1 | 5/2003 | Weng |
| 6,563,877 | B1 * | 5/2003 | Abbaszadeh ................. 375/242 |
| 6,637,002 | B1 | 10/2003 | Weng et al. |
| 6,639,865 | B2 | 10/2003 | Kwon |
| 6,643,331 | B1 * | 11/2003 | Farrell et al. .................. 375/261 |
| 6,674,665 | B1 | 1/2004 | Mann et al. |
| 6,675,281 | B1 | 1/2004 | Oh et al. |
| 6,704,902 | B1 | 3/2004 | Shinbashi et al. |
| 6,735,734 | B1 * | 5/2004 | Liebetreu et al. ............. 714/775 |
| 6,751,766 | B2 | 6/2004 | Guterman et al. |
| 6,772,274 | B1 | 8/2004 | Estakhri |
| 6,781,910 | B2 | 8/2004 | Smith |
| 6,792,569 | B2 | 9/2004 | Cox et al. |
| 6,873,543 | B2 | 3/2005 | Smith et al. |
| 6,891,768 | B2 | 5/2005 | Smith et al. |
| 6,914,809 | B2 | 7/2005 | Hilton et al. |
| 6,915,477 | B2 | 7/2005 | Gollamudi et al. |
| 6,952,365 | B2 | 10/2005 | Gonzalez et al. |
| 6,961,890 | B2 | 11/2005 | Smith |
| 6,968,421 | B2 | 11/2005 | Conley |
| 6,990,012 | B2 | 1/2006 | Smith et al. |
| 6,996,004 | B1 | 2/2006 | Fastow et al. |
| 6,999,854 | B2 | 2/2006 | Roth |
| 7,010,739 | B1 | 3/2006 | Feng et al. |
| 7,012,835 | B2 | 3/2006 | Gonzalez et al. |
| 7,038,950 | B1 | 5/2006 | Hamilton et al. |
| 7,068,539 | B2 | 6/2006 | Guterman et al. |
| 7,079,436 | B2 | 7/2006 | Perner et al. |
| 7,149,950 | B2 | 12/2006 | Spencer et al. |
| 7,173,978 | B2 * | 2/2007 | Zhang et al. .................. 375/298 |
| 7,177,977 | B2 | 2/2007 | Chen et al. |
| 7,188,228 | B1 | 3/2007 | Chang et al. |
| 7,191,379 | B2 | 3/2007 | Adelmann et al. |
| 7,196,946 | B2 | 3/2007 | Chen et al. |
| 7,203,874 | B2 | 4/2007 | Roohparvar |
| 7,212,426 | B2 | 5/2007 | Park et al |
| 7,290,203 | B2 | 10/2007 | Emma et al. |
| 7,292,365 | B2 | 11/2007 | Knox |
| 7,301,928 | B2 | 11/2007 | Nakabayashi et al. |
| 7,315,916 | B2 | 1/2008 | Bennett et al. |
| 7,388,781 | B2 | 6/2008 | Litsyn et al. |
| 7,395,404 | B2 | 7/2008 | Gorobets et al. |
| 7,441,067 | B2 | 10/2008 | Gorobets et al. |
| 7,443,729 | B2 | 10/2008 | Li et al. |
| 7,450,425 | B2 | 11/2008 | Aritome |
| 7,454,670 | B2 | 11/2008 | Kim et al. |
| 7,466,575 | B2 | 12/2008 | Shalvi et al. |
| 7,533,328 | B2 | 5/2009 | Alrod et al. |
| 7,558,109 | B2 | 7/2009 | Brandman et al. |
| 7,593,263 | B2 | 9/2009 | Sokolov et al. |
| 7,610,433 | B2 | 10/2009 | Randell et al. |
| 7,613,043 | B2 | 11/2009 | Cornwell et al. |
| 7,619,922 | B2 | 11/2009 | Li et al. |
| 7,681,105 | B1 * | 3/2010 | Sim-Tang et al. ............. 714/763 |
| 7,697,326 | B2 | 4/2010 | Sommer et al. |
| 7,706,182 | B2 | 4/2010 | Shalvi et al. |
| 7,716,538 | B2 | 5/2010 | Gonzalez et al. |
| 7,804,718 | B2 | 9/2010 | Kim |
| 7,805,663 | B2 | 9/2010 | Brandman et al. |
| 7,805,664 | B1 | 9/2010 | Yang et al. |
| 7,844,877 | B2 | 11/2010 | Litsyn et al. |
| 7,911,848 | B2 | 3/2011 | Eun et al. |
| 7,961,797 | B1 | 6/2011 | Yang et al. |
| 7,975,192 | B2 | 7/2011 | Sommer et al. |
| 8,020,073 | B2 | 9/2011 | Emma et al. |
| 8,108,590 | B2 | 1/2012 | Chow et al. |
| 8,122,328 | B2 | 2/2012 | Liu et al. |
| 8,159,881 | B2 | 4/2012 | Yang |
| 8,190,961 | B1 | 5/2012 | Yang et al. |
| 8,250,324 | B2 | 8/2012 | Haas et al. |
| 8,300,823 | B2 | 10/2012 | Bojinov et al. |
| 8,305,812 | B2 | 11/2012 | Levy et al. |
| 8,327,246 | B2 | 12/2012 | Weingarten et al. |
| 8,341,502 | B2 | 12/2012 | Steiner |
| 8,407,560 | B2 | 3/2013 | Ordentlich et al. |
| 8,417,893 | B2 | 4/2013 | Khmelnitsky et al. |
| 8,468,431 | B2 | 6/2013 | Steiner |
| 8,510,639 | B2 | 8/2013 | Steiner |
| 8,700,970 | B2 | 4/2014 | Steiner |
| 2001/0034815 | A1 | 10/2001 | Dugan et al. |
| 2002/0049947 | A1 * | 4/2002 | Sridharan et al. ............. 714/752 |
| 2002/0063774 | A1 | 5/2002 | Hillis et al. |
| 2002/0085419 | A1 | 7/2002 | Choi et al. |
| 2002/0154769 | A1 | 10/2002 | Petersen et al. |
| 2002/0156988 | A1 | 10/2002 | Sekibe et al. |
| 2002/0174156 | A1 | 11/2002 | Birru et al. |
| 2003/0014582 | A1 | 1/2003 | Nakanishi |
| 2003/0065876 | A1 | 4/2003 | Lasser |
| 2003/0101404 | A1 | 5/2003 | Zhao et al. |
| 2003/0105620 | A1 | 6/2003 | Bowen |
| 2003/0177300 | A1 | 9/2003 | Jeong et al. |
| 2003/0192007 | A1 | 10/2003 | Miller et al. |
| 2004/0015771 | A1 | 1/2004 | Lasser et al. |
| 2004/0030971 | A1 | 2/2004 | Shibata et al. |
| 2004/0059768 | A1 | 3/2004 | Denk et al. |
| 2004/0080985 | A1 | 4/2004 | Chang et al. |
| 2004/0153722 | A1 | 8/2004 | Lee |
| 2004/0153817 | A1 | 8/2004 | Chevallier et al. |
| 2004/0181735 | A1 | 9/2004 | Xin |
| 2004/0203591 | A1 | 10/2004 | Lee |
| 2004/0210706 | A1 | 10/2004 | In et al. |
| 2005/0013165 | A1 | 1/2005 | Ban |
| 2005/0018482 | A1 | 1/2005 | Cemea et al. |
| 2005/0083735 | A1 | 4/2005 | Chen et al. |
| 2005/0117401 | A1 | 6/2005 | Chen et al. |
| 2005/0120265 | A1 | 6/2005 | Pline et al. |
| 2005/0128811 | A1 | 6/2005 | Kato et al. |
| 2005/0138533 | A1 | 6/2005 | Le-Bars et al. |
| 2005/0144213 | A1 | 6/2005 | Simkins et al. |
| 2005/0144368 | A1 | 6/2005 | Chung et al. |
| 2005/0169057 | A1 | 8/2005 | Shibata et al. |
| 2005/0172179 | A1 | 8/2005 | Brandenberger et al. |
| 2005/0213393 | A1 | 9/2005 | Lasser |
| 2005/0243626 | A1 | 11/2005 | Ronen |
| 2006/0059406 | A1 | 3/2006 | Micheloni et al. |
| 2006/0059409 | A1 | 3/2006 | Lee |
| 2006/0064537 | A1 | 3/2006 | Oshima |
| 2006/0101193 | A1 | 5/2006 | Murin |
| 2006/0195651 | A1 | 8/2006 | Estakhri et al. |

(56) References Cited

U.S. PATENT DOCUMENTS

| | | |
|---|---|---|
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |

(56) References Cited

U.S. PATENT DOCUMENTS

| | | |
|---|---|---|
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir et al. |
| 2013/0132793 A1 | 5/2013 | Ha |

OTHER PUBLICATIONS

Search Report of PCT Patent Application WO 2009/095902 A3, Mar. 4, 2010.
Search Report of PCT Patent Application WO 2009/078006 A3, Mar. 4, 2010.
Search Report of PCT Patent Application WO 2009/074979 A3, Mar. 4, 2010.
Search Report of PCT Patent Application WO 2009/074978 A3, Mar. 4, 2010.
Search Report of PCT Patent Application WO 2009/072105 A3, Mar. 4, 2010.
Search Report of PCT Patent Application WO 2009/072104 A3, Mar. 4, 2010.
Search Report of PCT Patent Application WO 2009/072103 A3, Mar. 4, 2010.
Search Report of PCT Patent Application WO 2009/072102 A3, Mar. 4, 2010.
Search Report of PCT Patent Application WO 2009/072101 A3, Mar. 4, 2010.
Search Report of PCT Patent Application WO 2009/072100 A3, Mar. 4, 2010.
Search Report of PCT Patent Application WO 2009/053963 A3, Mar. 4, 2010.
Search Report of PCT Patent Application WO 2009/053962 A3, Mar. 4, 2010.
Search Report of PCT Patent Application WO 2009/053961 A3, Mar. 4, 2010.
Search Report of PCT Patent Application WO 2009/037697 A3, Mar. 4, 2010.
Yani Chen, Keshab K. Parhi, "Small Area Parallel Chien Search Architectures for Long BCH Codes", Ieee Transactions On Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction To Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips. com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions On Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com, 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., " Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

\* cited by examiner

PARALLEL ENCODING METHOD AND SYSTEM

CROSS REFERENCE TO RELATED APPLICATIONS

This application claims priority to co-pending U.S. patent application Ser. No. 14/323,857, entitled "Interleaved Encoding" by Hanan Weingarten and Avi Steiner, owned by the assignee of this application and incorporated by reference herein in its entirety.

BACKGROUND OF THE INVENTION

Multi-dimensional codes are widely used due to their potential efficiency. In NAND flash memory systems the reliability requirement dictates operation in extremely low output bit error rate (BER), for example, this can be output BER that is below ten by the power of minus fifteen.

For achieving such goal the encoding system should have a very low error-floor. There are various methods of designing codes and decoder for low error floor. Novel methods for encoding and decoding for obtaining low-error-floor codes are suggested in this application.

SUMMARY

According to an embodiment of the invention there may be provided a method for parallel multi-dimensional encoding, the method may include receiving or generating a first version of a group of bits and a second version of the group of bits, wherein the first and second versions differ from each other by an arrangement of bits of the data unit; selecting a first set of bits of the first version and a second set of bits of the second version; encoding, in parallel, the first set of bits and the second set of bits; wherein the encoding of the second set of bits is responsive to the second set of bits and a first redundancy result of the encoding of the first set of bits; and wherein the encoding of the first set of bits is responsive to the first set of bits and to a second redundancy result of the encoding of the second set of bits.

The first set of bits may be a part of the first version and the second set of bits may be a part of the second version.

The first set of bits may equal the first version and the second set of bits may equal the second version.

At least one of the first set of bits and the second set of bits may include data bits and does not include redundancy bits.

At least one of the first set of bits and the second set of bits may not include data bits and may include redundancy bits.

Each one of the first set of bits and the second set of bits may not include data bits and may include redundancy bits.

The encoding of the second set of bits may be executed by applying an encoding process that is associated with the second set of bits.

At least one of the first and second versions may be an interleaved version of the group of bits.

The method may include selecting and the encoding until all first sets of bits of the first version are selected and encoded.

The method may include repeating the selecting and the encoding until only a part of all first sets of bits of the first version are selected and encoded.

The encoding, in parallel, of the first set of bits and the second set of bits may include solving a linear equation system for computation of the redundancy result such that redundancy bits of each codeword component is encoded by another codeword component.

The encoding, in parallel, of the first set of bits and the second set of bits may include solving a linear equation system for computation of the redundancy result of the encoding of the first set of bits and a second estimated result of the encoding of the second set of bits that do not contradict each other.

The encoding, in parallel, of the first set of bits and the second set of bits may include receiving or generating multiple first estimated results and multiple second estimated results; and finding, out of the multiple first and second estimated results, a pair of first and second estimated results that match outcomes of the encoding of the first set of bits and of the encoding of the second set of bits respectively.

The encoding, in parallel, may include receiving or calculating a syndrome vector (S) which depends on redundancy bits of other component codes and a primitive element matrix (Mr); and creating an equation system for a vector of redundancy bits that represents an output of the encoding of the first and second sets of bits.

The primitive element matrix (Mr) may include first, second, third and fourth sub-matrixes that differ from each other; wherein each one of the first, second, third and fourth sub-matrixes may include powers of a primitive element associated with at least one of the first and second versions.

There may be provided according to an embodiment of the invention a non-transitory computer readable medium that stores instructions that once executed by the computer causes the computer to perform the stages of receiving or generating a first version of a group of bits and a second version of the group of bits, wherein the first and second versions differ from each other by an arrangement of bits of the data unit; selecting a first set of bits of the first version and a second set of bits of the second version; encoding, in parallel, the first set of bits and the second set of bits; wherein the encoding of the second set of bits is responsive to the second set of bits and a first redundancy result of the encoding of the first set of bits; and wherein the encoding of the first set of bits is responsive to the first set of bits and to a second redundancy result of the encoding of the second set of bits.

There may be provided according to an embodiment of the invention a system that may include an encoder and a memory unit; wherein the encoder is arranged to receive or generate a first version of a group of bits and a second version of the group of bits, wherein the first and second versions differ from each other by an arrangement of bits of the data unit; select a first set of bits of the first version and a second set of bits of the second version; encode, in parallel, the first set of bits and the second set of bits; wherein an encoding of the second set of bits is responsive to the second set of bits and a first redundancy result of the encoding of the first set of bits; and wherein the encoding of the first set of bits is responsive to the first set of bits and to a second redundancy result of the encoding of the second set of bits.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which

DETAILED DESCRIPTION OF THE DRAWINGS

Figure 1:
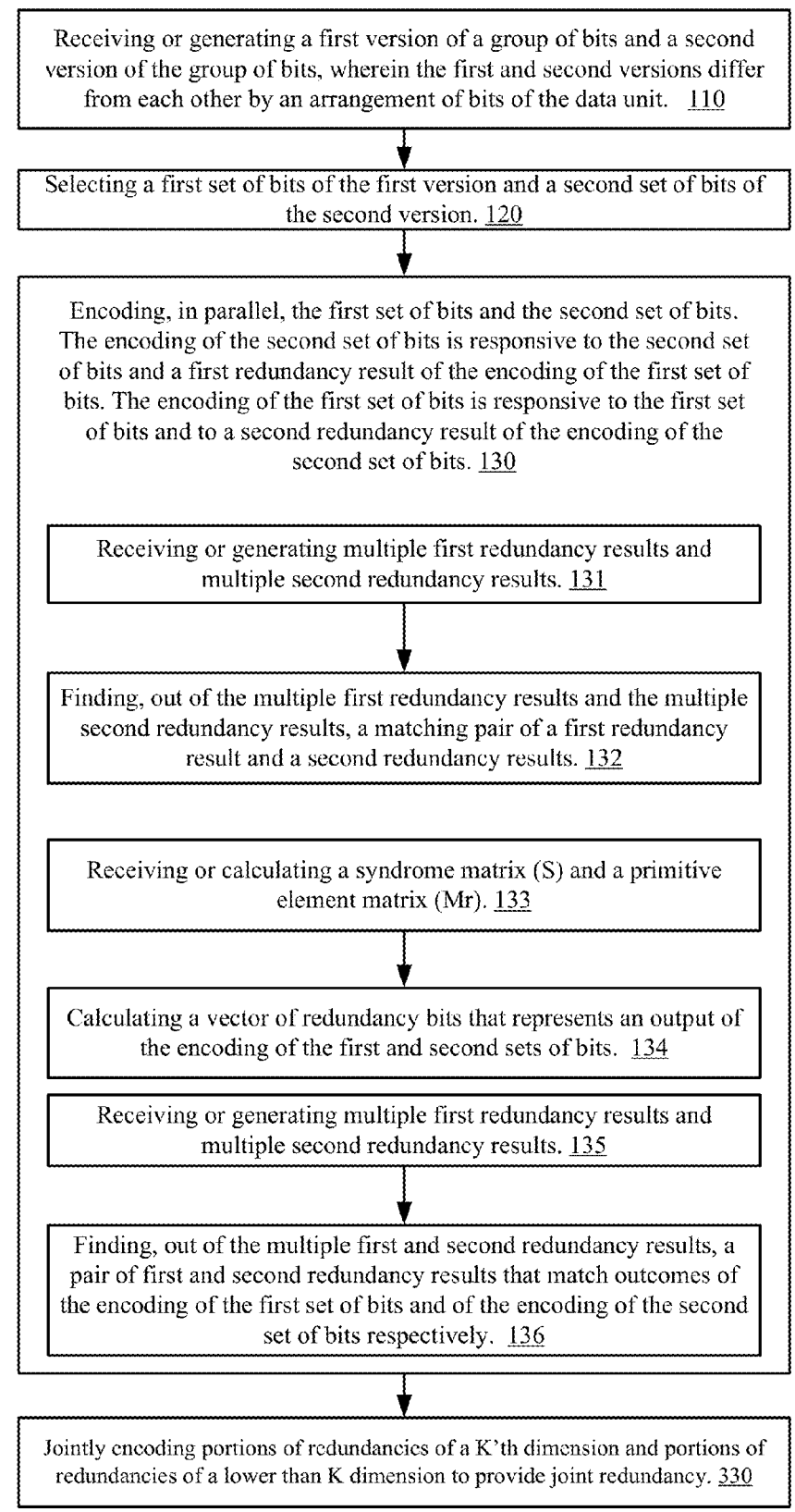
FIG. 1 illustrates a method according to an embodiment of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

Multi-dimensional encoding invoices receiving or generating multiple versions of a group of bits. The different versions differ from each other by the arrangement of bits. Different versions are associated with different dimensions. For example—assuming that there are two dimensions and that the bits of the group of bits are arranged in a virtual (rectangular) matrix. According to a first arrangement of the bits (first dimension) payloads are formed by the rows of the matrix. According to a second arrangement of the bits (second dimension) payloads are formed by the columns of the matrix. In a non-folded arrangement each payload occupies a single row or column. In a folded arrangement a single payload (of a single codeword component) can occupy more than a single row or column.

Various examples of multi-dimensional encoding are provided in U.S. Pat. Nos. 8,700,970, 8,341,502, 8,621,321, 8,510,639, 8,468,431 and US patent application 20130132793, all being incorporated herein by reference.

Prior art multi-dimensional encoding included serial concatenation, where a dimension is encoded only after another dimension was entirely encoded. This way, the redundancy of one dimension is protected by the other dimension. However, the last dimension may be unprotected. Another prior art (3D application) the each dimension encoding generates a redundancy for codeword components of its dimension, the resulting overall redundancy may then be encoded with another encoder. This type of encoding is not too efficient as the redundancy is protected due to an additional code, and does not take part in the encoding process (like suggested in this invention).

FIG. 1 illustrates method 100 according to an embodiment of the invention.

Method 100 is for parallel multi-dimensional encoding. Method 100 may start by stage 110 of receiving or generating a first version of a group of bits and a second version of the group of bits, wherein the first and second versions differ from each other by an arrangement of bits of the data unit. The first version may be referred to as a first dimension and the second version may be referred to as a second dimension.

Stage 110 may be followed by stage 120 of selecting a first set of bits of the first version and a second set of bits of the second version.

Stage 120 may be followed by stage 130 of encoding, in parallel, the first set of bits and the second set of bits. The encoding of the second set of bits is responsive to the second set of bits and a first redundancy result of the encoding of the first set of bits. The encoding of the first set of bits is responsive to the first set of bits and to a second redundancy result of the encoding of the second set of bits.

The first set of bits may be a part of the first version and the second set of bits may be a part of the second version.

The first set of bits may equal the first version and the second set of bits may equal the second version.

One or more of the first set of bits and the second set of bits may include data bits and does not include redundancy bits.

One or more of the first set of bits and the second set of bits may not include data bits and comprises redundancy bits.

Each one of the first set of bits and the second set of bits may not include data bits and comprises redundancy bits.

The encoding of the second set of bits may be executed by applying an encoding process that is associated with the second set of bits.

One or more of the first and second versions is an interleaved version of the group of bits.

Stages 120 and 130 may be repeated until one, only a part of, or all first sets of bits of the first version are selected and encoded.

Because of the parallel nature of the encoding process the encoding, in parallel, of the first set of bits and the second set of bits may include finding a first redundancy result of the encoding of the first set of bits and a second redundancy result of the encoding of the second set of bits that do not contradict each other.

Stage 130 may include stage 131 of receiving or generating multiple first redundancy results and multiple second redundancy results; and stage 132 of finding, out of the multiple first redundancy results and the multiple second redundancy results, a matching pair of a first redundancy result and a second redundancy result.

The parallel encoding may include stage 133 of receiving or calculating a syndrome matrix (S) and a primitive element matrix (Mr).

Stage 133 may be followed by stage 134 of calculating a vector of redundancy bits that represents an output of the encoding of the first and second sets of bits.

The primitive element matrix (Mr) may include first, second, third and fourth sub-matrixes that differ from each other. Each one of the first, second, third and fourth sub-matrixes may include powers of a primitive element associated with at least one of the first and second versions, to represent the linear encoding operation. Some examples of the sub-matrixes are provided below and are denoted as A1, A2, B and C.

Figure 2:
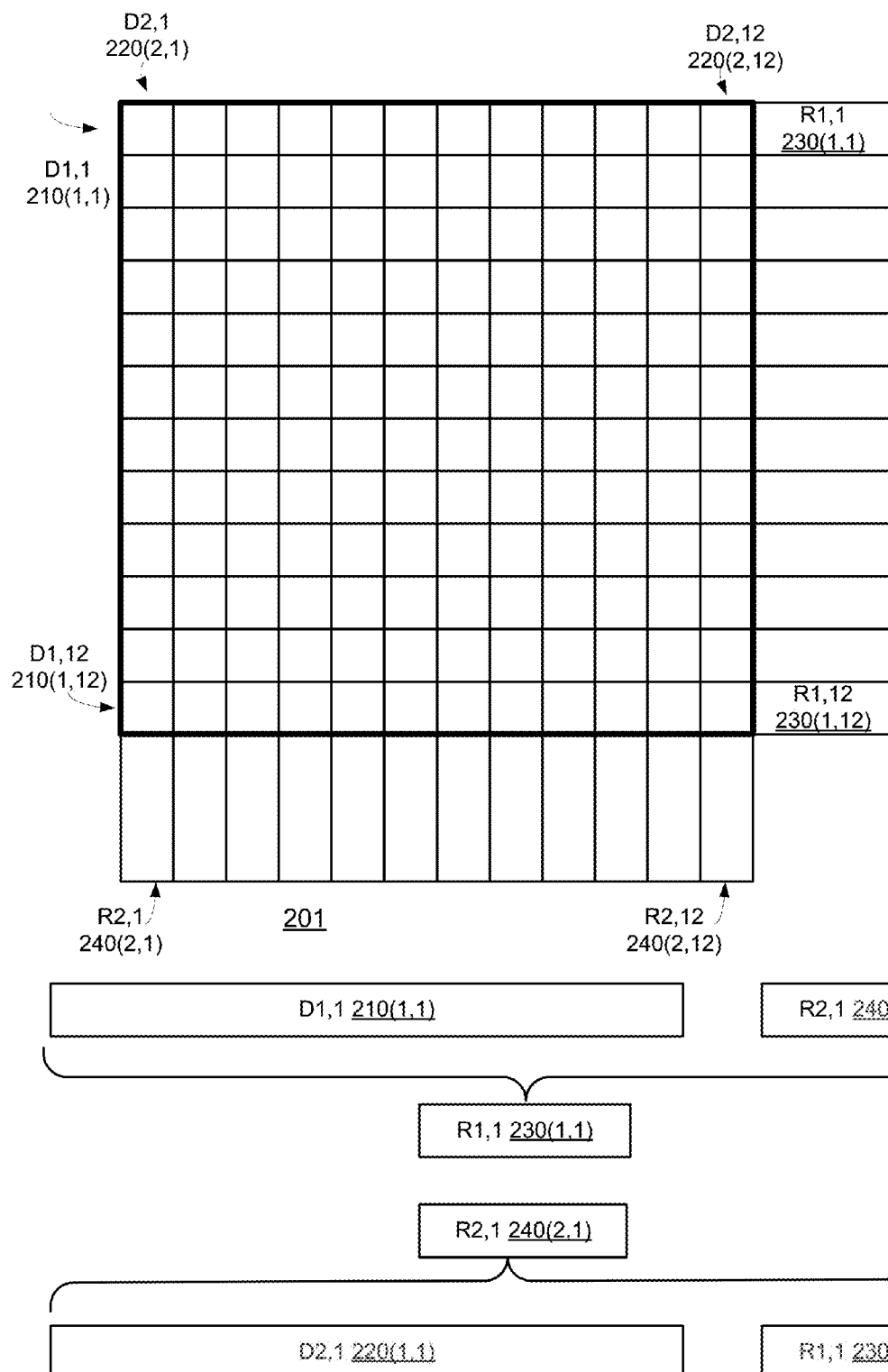
FIG. 2 illustrate a codeword according to various embodiments of the invention.

FIG. 2 illustrates two dimensional codeword 201 according to an embodiment of the invention. The two dimensional codeword 201 includes row payloads D1,1-D1,12 210(1,1)-210(1,12) that occupy one row each and include only data bits. It also includes column payloads D2,1-D2,12 220(1,1)-220(1,12) that occupy one row each and include only data bits.

The row payloads and the row redundancies form row codeword components. The column payloads and the column redundancies form column codeword components.

At least some of the row and column redundancies were encoded in parallel to each other.

For example, the first row payload D1,1 210(1,1) and a first column redundancy ("R2,1 240(2,1)) were encoded to provide first row redundancy R1,1 230(1,1) while the first column payload D2,1 220(2,1) and an first row redundancy (R1,1 230(1,1)) were encoded to provide first column redundancy R2,1 240(2,1). This means that codeword components of different dimensions mutually encode the redundancy bits of each other. That is, the codeword component with redundancy R2,1 240 includes D2,1 220 and R1,1 230 as its payload, and the codeword component with redundancy R1,1 230 includes D1,1 210 and R1,1 230 as its payload.

The encoding process may include computation of the redundancies by solving an equation system obtained by inversion of an encoding matrix and multiplication by a syndrome vector, e.g. $\bar{r}=M_R^{-1}\cdot S(\bar{r})$ where $M_R$ is the encoding matrix and $S(\bar{r})$ is the syndrome vector, which is computed with the payload bits (note that since a mutual encoding is performed, each codeword payload consists of redundancy bits of the another codeword) both syndrome and encoder matrix can be directly computed from the code definition. It is noted that $M_R$ should be chosen such that it is an invertible matrix.

It is noted that the mentioned above method can be applied on folded codeword components (that span along more than a single row and column) and to more than two dimensions.

It is further noted that the length of the codeword components and/or the code rate may vary between different codeword components.

Figure 3:
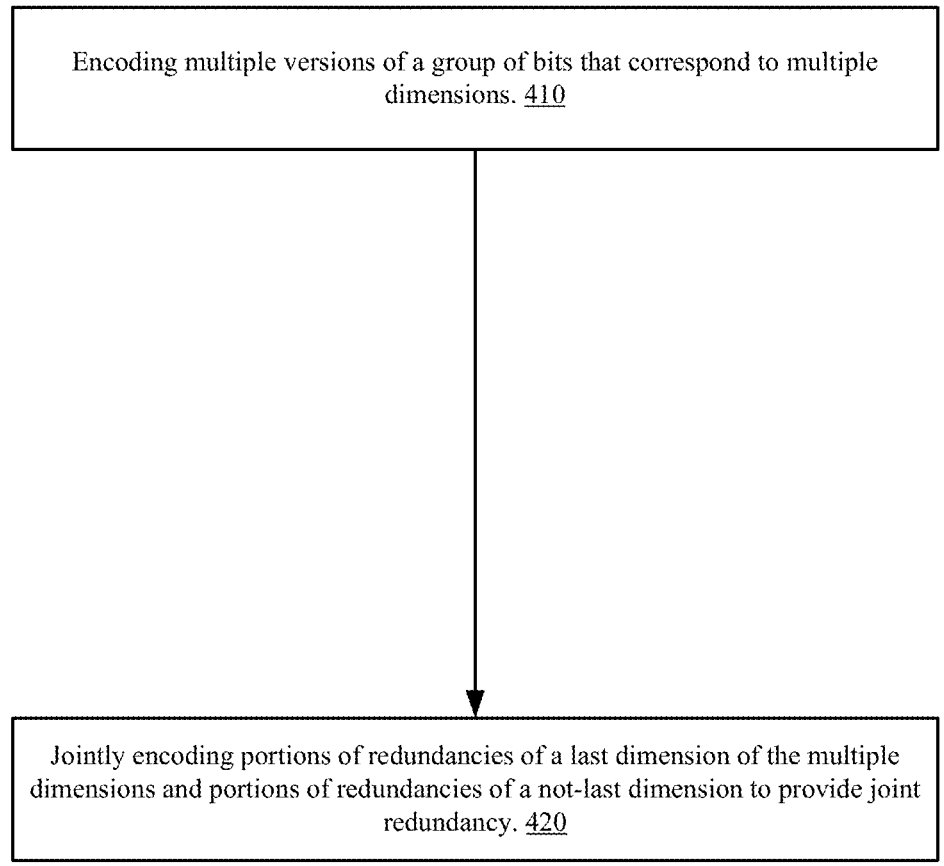
FIG. 3 illustrates a method according to an embodiment of the invention.

FIG. 3 illustrates a method 400 for multi-dimensional encoding, according to an embodiment of the invention.

Method 400 may start by stage 410 of encoding multiple versions of a group of bits that correspond to multiple dimensions. Stage 410 may include any stage of method 300. Other encoding schemes may be used.

Stage 410 may be followed by stage 420 of jointly encoding portions of redundancies of a last dimension of the multiple dimensions and portions of redundancies of a not-last dimension to provide joint redundancy.

The joint redundancy may include multiple joint redundancy units, wherein at least one joint redundancy unit is generated by encoding at least a portion of a last dimension redundancy unit and at least a portion of the non-last redundancy portion.

Figure 4:
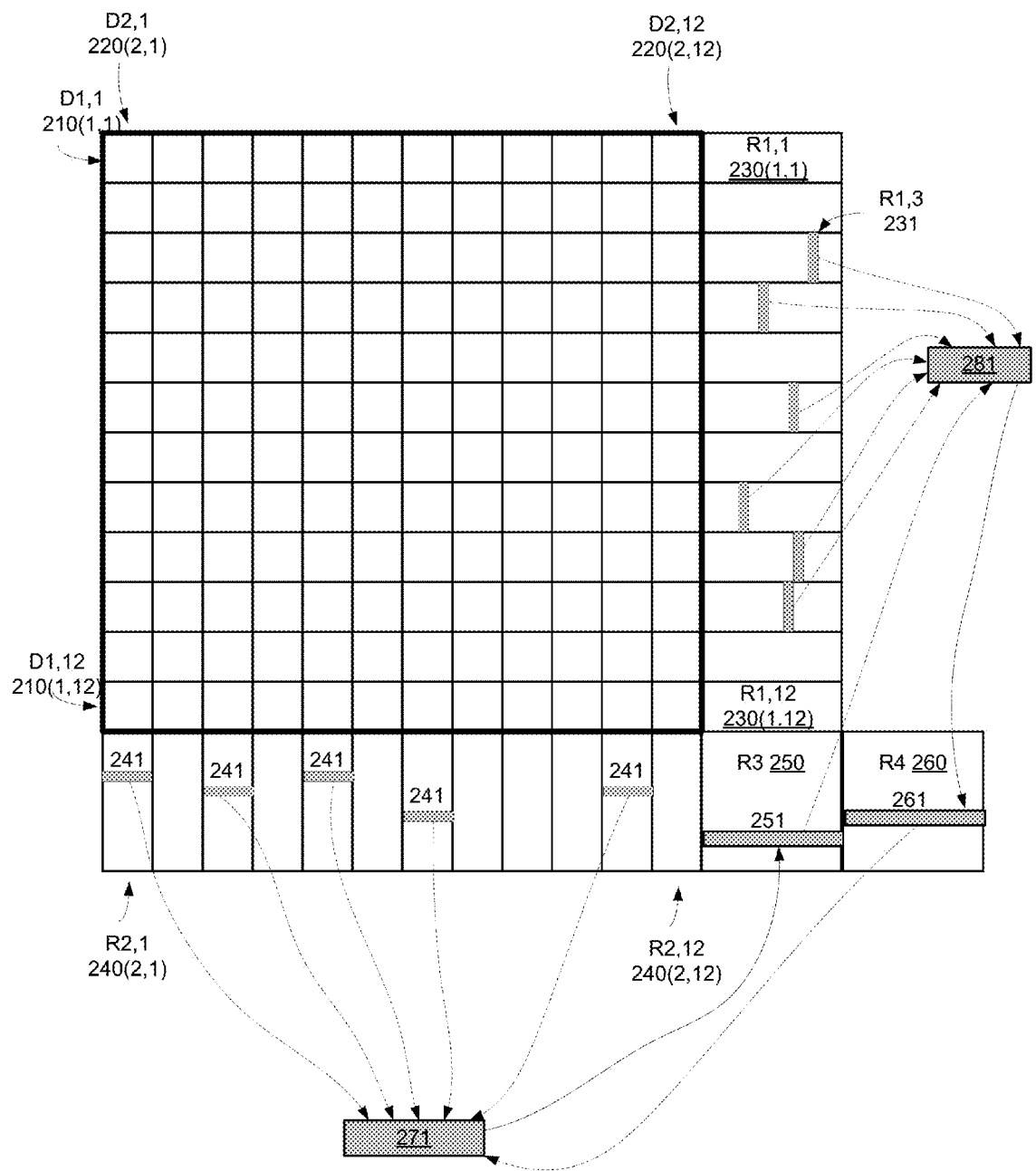
FIGS. 4-5 illustrate a two dimensional codeword according to various embodiments of the invention.
Figure 5:
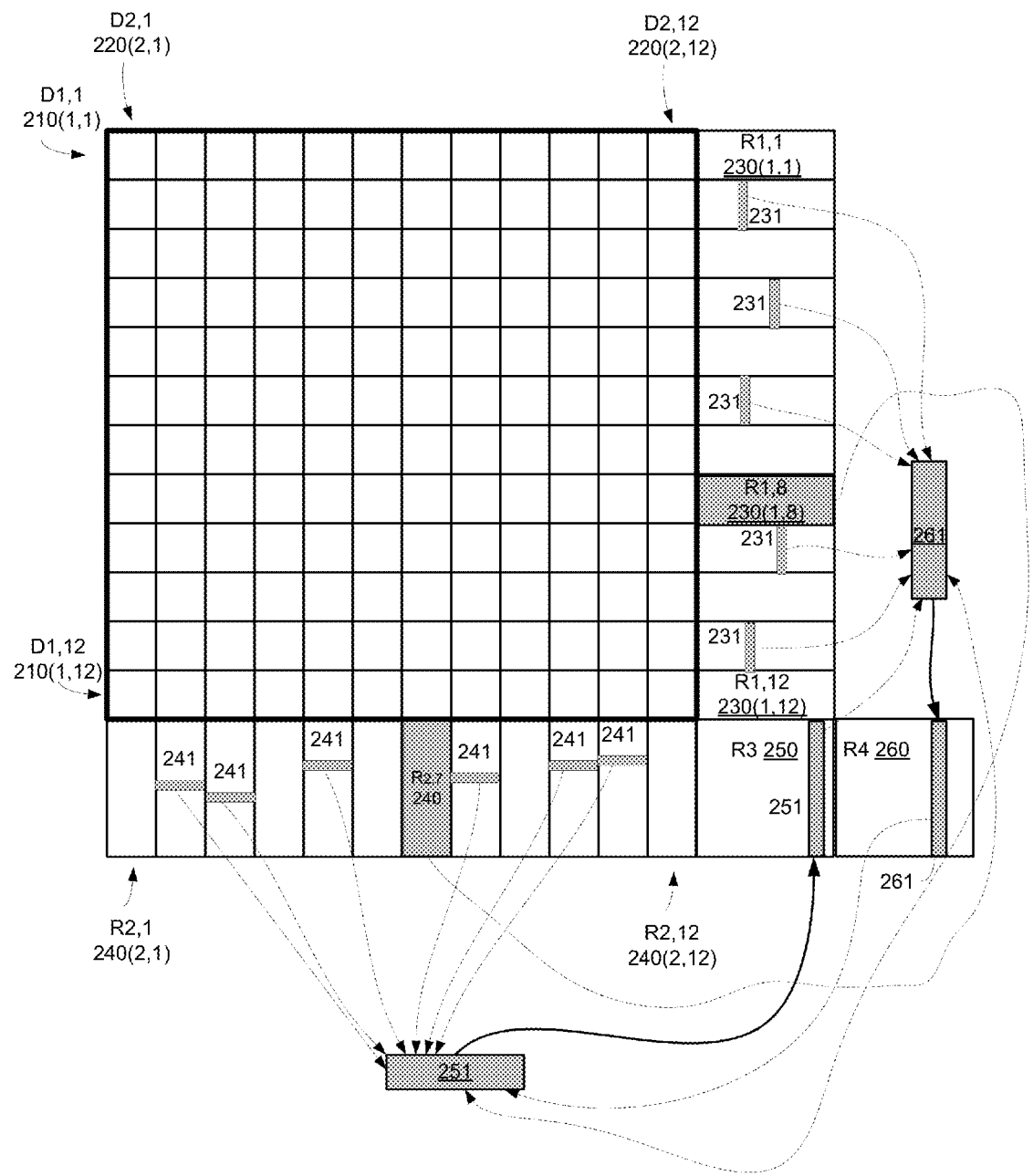

FIGS. 4-5 illustrates two dimensional codeword 200 according to various embodiments of the invention. It includes row payloads D1,1-D1,12 210(1,1)-210(1,12) that occupy one row each and include only data bits. It also includes column payloads D2,1-D2,12 220(1,1)-220(1,12) that occupy one row each and include only data bits.

The row payloads (first dimension, first version) were encoded to provide row redundancies R1,1-R1,12 230(1,1)-230(1,12).

The column payloads (second dimension, second version) were encoded to provide column redundancies R2,1-R2,12 240(2,1)-240(2,12).

FIG. 4 illustrates a joint redundancy R3 250 and R4 260 that include first redundancy units, each is calculated by encoding a single column redundancy, and a second joint redundancy R4 260 that includes second redundancy units, each calculated by encoding a single row. For obtaining joint encoding of R3 250 and R4 260, multiple column redundancy bits (241) are encoded jointly with multiple row redundancy bits 231 in the following way. For column redundancy bits 241 and redundancy bits 261 a redundancy 251 is computed, and for row redundancy bits 231 and redundancy bits 251 a redundancy 261 is computed. That is, the payload corresponding to redundancy bits R3 251 consists of 241 and 261, and the payload corresponding to redundancy bits R4 261 consists of 231 and 251. To compute R3 251 and R4 261 an equation system corresponding to encoder definition is to be computed, as explained earlier by $\bar{r}=M_R^{-1}\cdot S(\bar{r})$.

FIG. 5 illustrates a second joint redundancy encoding of R3 250 and R4 260 that includes first joint redundancy units, each is calculated by encoding a single column redundancy and multiple bits from multiple row redundancies and the other redundancy result 251. For example second joint redundancy unit 261 is calculated by encoding R2,7 240(2,7) and multiple bits (231) from multiple row redundancies and R3 251. At the same time, first joint redundancy unit 251 is calculated by encoding R1,8 230(1,8), multiple bits (241) from multiple column redundancies and R4 261

It is noted that only one of the first and second joint redundancies can be provided, that the encoding can be applied to more than two dimensions and that the encoding may also be responsive to the data bits and not just to the redundancies.

Simultaneous Redundancy Termination

Standard Case

We consider the encoding scheme of the two dimensions.

It is suggested to calculate the redundancies of different dimensions is parallel. This can be done by performing syndrome calculation in a manner that creates the redundancy for multiple dimensions simultaneously.

Per codeword component per dimension, it is possible to calculate the syndrome (as is done during the decoding process) as follows:

$$S_{D,i} = \sum_{j=0}^{k_{D,i}} d_{D,i}(n_{D,i}-j) \cdot \begin{pmatrix} \alpha_D^{n_{D,i}-j} \\ \alpha_D^{3\cdot(n_{D,i}-j)} \\ \alpha_D^{5\cdot(n_{D,i}-j)} \end{pmatrix}$$

Where
a. D Dimension index (½)
b. i Codeword component index within dimension
c. $n_{D,i}$ Codeword component length for codeword component i of dimension D
d. $d_{D,i}(n_{D,i}-j)$ Bit $n_{D,i}-j$ of codeword component i of dimension D
e. $\alpha_D$ Primitive element of the fields used for dimension D
f. $NI_D$ Number of codeword components in dimension D
g. $Q_D$ Field used in codeword components of dimension D
h. $t_D$ Number of errors corrected per codeword component of dimension D To calculate the redundancy we stack the binary representation of the syndromes ($S_{D,i}$) one on top of the other (for all inner codes within each dimension, for both dimensions) such that $$S = \begin{pmatrix} S_{1,1} \\ S_{1,2} \\ \vdots \\ S_{1,NI_1} \\ S_{2,1} \\ S_{2,2} \\ S_{2,3} \\ \vdots \\ S_{2,NI_2} \end{pmatrix}$$

We can now write a linear binary equation that relates between the calculated syndromes and the redundancy as follows:

$$M_R \cdot \bar{r} = S, \bar{r} = M_R^{-1} \cdot S$$

Where $\bar{r}$ is a bit vector containing the redundancy bits of all the codeword components where the first $NI_1 \cdot Q_1 \cdot t_1$ bits correspond to the redundancy of the codeword components of dimension 1 and the last $NI_2 \cdot Q_2 \cdot t_2$ correspond to the redundancy of the codeword components of dimension 2.

The matrix $M_R$ is a block diagonal matrix defines by $$M_R = \begin{pmatrix} A_1 & 0 & 0 & & & \\ 0 & A_1 & 0 & \ldots & & 0 \\ 0 & 0 & A_1 & & & \\ \vdots & & & \ddots & & \vdots \\ & & & & A_2 & 0 \\ 0 & & \ldots & & 0 & A_2 \end{pmatrix}$$

Where there are $NI_D$ binary blocks $A_D$ (D=1,2). Where $$A_D = \begin{pmatrix} \alpha_D^{Q_D \cdot t_D - 1} & \ldots & \alpha_D^0 \\ \alpha_D^{3 \cdot (Q_D \cdot t_D - 1)} & \ldots & \alpha_D^{3 \cdot 0} \\ \alpha_D^{5 \cdot (Q_D \cdot t_D - 1)} & \ldots & \alpha_D^{5 \cdot 0} \end{pmatrix}$$

is represented using the binary representation of each of the primitive value powers.

Serial Encoding

The matrix $M_R$ above yields the standard redundancies, without any simultaneous termination. However, with some modifications to $M_R$, some more dependencies can be enforced between the redundancies of the two dimensions.

For example, by setting $$\tilde{M}_R = \begin{pmatrix} A_1 & 0 & 0 & & & B \\ 0 & A_1 & 0 & \ldots & & \\ 0 & 0 & A_1 & & & \\ \vdots & & & \ddots & & \vdots \\ & & & & A_2 & 0 \\ 0 & & \ldots & & 0 & A_2 \end{pmatrix}$$

We can simulate serial encoding.

That is the case where the codeword components of dimension 1 are encoded after encoding the codeword components of dimension 2 and the payload of dimension 1 codeword components contain some of the redundancy of dimension 2 codes.

FIGS. 4 and 5 show an example of how the bits of an inner are allocated across data payload and redundancy bits.

In this case, we denote by $I_{D,i}(j)$ The indexes (j=1, ..., $nr_{D,i}$) of the codeword components redundancy bits of dimension (3-D) that are used in the payload of codeword component i of dimension D.

$nr_{D,i}$ The number of bits out of the codeword components redundancy bits of dimension (3-D) that are used in the payload of codeword i of dimension D.

The matrix B in the matrix $\tilde{M}_R$ is an $NI_1 \cdot Q_1 \cdot t_1 \times NI_2 \cdot Q_2 \cdot t_2$ binary matrix that is divided into i=1, ..., $NI_1$ sub-matrices $Q_1 \cdot t_1 \times NI_2 \cdot Q_2 \cdot t_2$ which have none zero columns $$\begin{pmatrix} \alpha_D^{Q_D \cdot t_D + nr_{D,i} - j} \\ \alpha_D^{3 \cdot (Q_D \cdot t_D + nr_{D,i} - j)} \\ \alpha_D^{5 \cdot (Q_D \cdot t_D + nr_{D,i} - j)} \end{pmatrix},$$

j=1 ... $nr_{D,i}$ in locations $I_{D,i}(j)$ (where D=1).

One method for setting the indexes $I_{D,i}(j)$ is setting $I_{D,i}(j) = (j + \sum_{k=1}^{i-1} nr_{D,k}) \cdot P_D$ modulo $NI_{3-D} \cdot Q_{3-D} \cdot t_{3-D}$ where $P_D$ is chosen such that it has no common denominators with $NI_{3-D}$, j=1 ... $nr_{D,i}$ and $$nr_{D,i} = \text{round}\left(NI_{3-D} \cdot Q_{3-D} \cdot \frac{t_{3-D}}{NI_D}\right),$$

i=1 ... $NI_D - 1$ $$nr_{D,NI_D} = NI_{3-D} \cdot Q_{3-D} \cdot t_{3-D} - \sum_{k=1}^{NI_D - 1} nr_{D,k}$$

Simultaneous Redundancy Encoding

The matrix $\tilde{M}_R$ can be further extended to define simultaneous redundancy encoding of the two dimensions. This would mean the all bits, payload and redundancy are protected by two codes, each from each dimension.

This is done by defining the matrix $$\hat{M}_R = \begin{pmatrix} A_1 & 0 & 0 & & & \\ 0 & A_1 & 0 & \cdots & & B \\ 0 & 0 & A_1 & & & \\ \vdots & & & \ddots & & \vdots \\ & & & & A_2 & 0 \\ & C & & \cdots & 0 & A_2 \end{pmatrix}$$

Where on top of the matrix B we define a similar matrix C ($NI_2 \cdot Q_2 \cdot t_2 \times NI_1 \cdot Q_1 \cdot t_1$) which is defined similarly to B, except for interchanging the dimensions.

To perform encoding the following calculation should be performed: $\bar{r} = \hat{M}_R^{-1} \cdot S$.

It should be noted that if the indexes $I_{D,i}(j)$ are chosen using the methods defined above, the number $P_D$ for each dimension should be chosen such that $\hat{M}_R$ is indeed invertible (under GF(2)).

Furthermore, by using the above encoding method, the codeword components become longer and therefore, may become weaker. To limit the impact on the strength of the codeword components, it may be possible make the matrices B and C sparser (for example by setting the number of bits $nr_{D,i}$ smaller. The result may be that not all redundancy bits are protected by both dimensions.

However, the codeword components will be shorter, making them more powerful.

Joint Redundancy of Redundancy Codes

The calculation of $\bar{r} = \hat{M}_R^{-1} \cdot S(\bar{r})$, from which $\bar{r}$ is computed by a large equation system may require too much resources as the matrix $\hat{M}_R$ may be too large, as well as the number of equations to solve a long vector $\bar{r}$. Therefore, an alternative approach is depicted in FIGS. 4-5. In this new scheme the two dimensions are encoded as described in the standard case. However, now we encode redundancy of both dimensions jointly. That is, redundancy R1 (redundancy of dimension 1) is jointly encoded with redundancy R2 (redundancy of dimension 2). The encoding is done in a manner that simultaneously calculates the redundancies as described in the method above. However, now the inverse matrix will be much smaller since it will include fewer codeword components.

Figure 6:
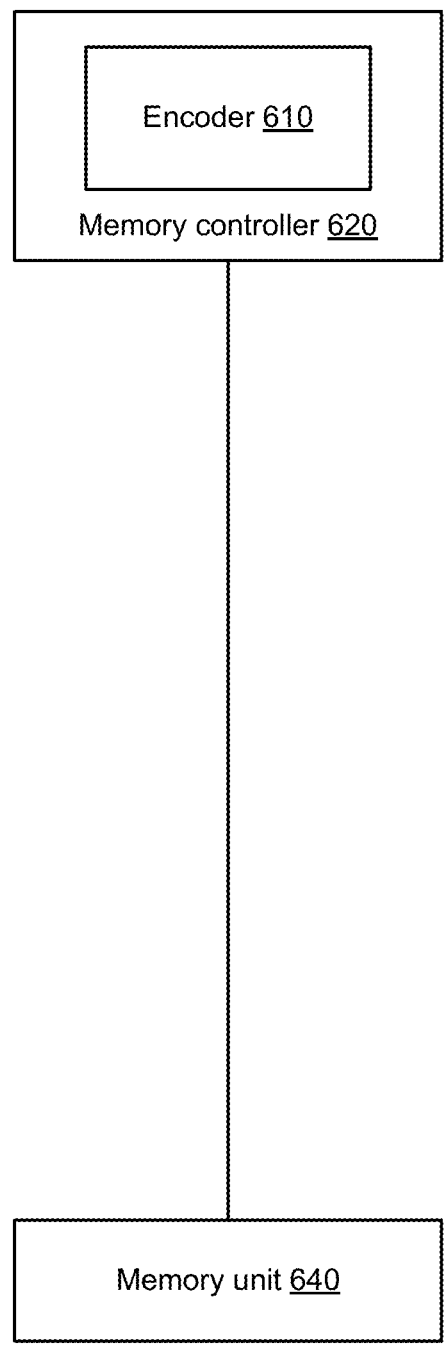
FIG. 6 illustrates a system according to an embodiment of the invention.

FIG. 6 illustrates a system 600 for multi-dimensional encoding, according to an embodiment of the invention. The system 600 includes a memory unit 640 and a memory controller 620 that includes an encoder 610. The encoder 610 can perform any method illustrated in the specification. The memory controller 620 can control the storage of the codewords at the memory unit 640, can retrieve the codewords and decode then to extract data.

It is noted that the decoding process may be done in various manners. The decoding can also be interleaved.

Non-limiting examples of decoding include:
a. Irregular multi-dimensional decoding (using codeword components of different size and/or different rate).
b. Using soft decoding with list decoding.
c. Applying hard and/or soft decoding with false correction elimination (FCE) methods.
d. Performing hard decoding with intersections decoding.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for parallel multi-dimensional encoding, the method comprises:
   receiving or generating a first version of a group of bits and a second version of the group of bits, wherein the first and second versions differ from each other by an arrangement of bits of the data unit;
   selecting a first set of bits of the first version and a second set of bits of the second version;
   encoding, in parallel, the first set of bits and the second set of bits;
      wherein the encoding of the second set of bits is responsive to the second set of bits and a first redundancy result;
      wherein the first redundancy result is calculated by applying an encoding process on a first payload that is associated with the first set of bits;
      wherein the encoding of the first set of bits is responsive to the first set of bits and to a second redundancy result; and
      wherein the second redundancy result is calculated by applying an encoding process on a second payload that is associated with the second set of bits.

2. The method according to claim 1 wherein first set of bits is a part of the first version and the second set of bits is a part of the second version.

3. The method according to claim 1 wherein first set of bits equals the first version and the second set of bits equals the second version.

4. The method according to claim 1 wherein at least one of the first set of bits and the second set of bits comprises data bits and does not include redundancy bits.

5. The method according to claim 1 wherein at least one of the first set of bits and the second set of bits does not include data bits and comprises redundancy bits.

6. The method according to claim 1 wherein each one of the first set of bits and the second set of bits does not include data bits and comprises redundancy bits.

7. The method according to claim 1 wherein the encoding of the second set of bits is executed by applying an encoding process that is associated with the second set of bits.

8. The method according to claim 1 wherein at least one of the first and second versions is an interleaved version of the group of bits.

9. The method according to claim 1 comprising selecting and the encoding until all first sets of bits of the first version are selected and encoded.

10. The method according to claim 1 comprising repeating the selecting and the encoding until only a part of all first sets of bits of the first version are selected and encoded.

11. The method according to claim 1 wherein the encoding, in parallel, of the first set of bits and the second set of bits generates a multi-dimensional codeword and comprises calculating redundancies that solving a linear equation system for computation of redundancies of the multi-dimensional codeword.

12. The method according to claim 1 wherein the encoding, in parallel, of the first set of bits and the second set of bits comprises:
receiving or generating multiple first estimated results of encoding of the first set of bits and multiple second estimated results of the encoding of the second set of bits;
finding, out of the multiple first and second estimated results, a pair of first and second estimated results that match outcomes of the encoding of the first set of bits and of the encoding of the second set of bits respectively.

13. The method according to claim 1 wherein the encoding, in parallel, comprises receiving or calculating a syndrome vector and a primitive element matrix; and creating an equation system for a vector of redundancy bits that represents an output of the encoding of the first and second sets of bits.

14. The method according to claim 13 wherein the primitive element matrix comprises first, second, third and fourth sub-matrixes that differ from each other; wherein each one of the first, second, third and fourth sub-matrixes comprises powers of a primitive element associated with at least one of the first and second versions.

15. A non-transitory computer readable medium that stores instructions that once executed by the computer causes the computer to perform the stages of:
receiving or generating a first version of a group of bits and a second version of the group of bits, wherein the first and second versions differ from each other by an arrangement of bits of the data unit;
selecting a first set of bits of the first version and a second set of bits of the second version;
encoding, in parallel, the first set of bits and the second set of bits;
wherein the encoding of the second set of bits is responsive to the second set of bits and a first redundancy result;
wherein the first redundancy result is calculated by applying an encoding process on a first payload that is associated with the first set of bits;
wherein the encoding of the first set of bits is responsive to the first set of bits and to a second redundancy result; and
wherein the second redundancy result is calculated by applying an encoding process on a second payload that is associated with the second set of bits.

16. The non-transitory computer readable medium according to claim 15 wherein the encoding, in parallel, of the first set of bits and the second set of bits generates a multi-dimensional codeword and comprises calculating redundancies that solving a linear equation system for computation of redundancies of the multi-dimensional codeword.

17. The non-transitory computer readable medium according to claim 15, wherein the encoding, in parallel, of the first set of bits and the second set of bits comprises:
receiving or generating multiple first estimated results of encoding of the first set of bits and multiple second estimated results of the encoding of the second set of bits; and
finding, out of the multiple first and second estimated results, a pair of first and second estimated results that match outcomes of the encoding of the first set of bits and of the encoding of the second set of bits respectively.

18. The non-transitory computer readable medium according to claim 15, wherein the encoding, in parallel, comprises receiving or calculating a syndrome vector and a primitive element matrix; and creating an equation system for a vector of redundancy bits that represents an output of the encoding of the first and second sets of bits.

19. The non-transitory computer readable medium according to claim 18, wherein the primitive element matrix comprises first, second, third and fourth sub-matrixes that differ from each other; wherein each one of the first, second, third and fourth sub-matrixes comprises powers of a primitive element associated with at least one of the first and second versions.

20. A system comprising an encoder and a memory unit; wherein the encoder is arranged to:
receive or generate a first version of a group of bits and a second version of the group of bits, wherein the first and second versions differ from each other by an arrangement of bits of the data unit;
select a first set of bits of the first version and a second set of bits of the second version; and
encode, in parallel, the first set of bits and the second set of bits;
wherein an encoding of the second set of bits is responsive to the second set of bits and a first redundancy result;
wherein the first redundancy result is calculated by applying an encoding process on a first payload that is associated with the first set of bits;
wherein the encoding of the first set of bits is responsive to the first set of bits and to a second redundancy result of the encoding of the second set of bits; and
wherein the second redundancy result is calculated by applying an encoding process on a second payload that is associated with the second set of bits.

* * * * *